United States Patent

Xu et al.

Patent Number: 5,851,344
Date of Patent: Dec. 22, 1998

[54] ULTRASONIC WAVE ASSISTED CONTACT HOLE FILLING

[75] Inventors: Zheng Xu, Foster City; Fusen Chen, Cupertino, both of Calif.

[73] Assignee: Applied Materials, Inc., Santa Clara, Calif.

[21] Appl. No.: 717,525

[22] Filed: Sep. 24, 1996

Related U.S. Application Data

[62] Division of Ser. No. 570,762, Dec. 12, 1995, Pat. No. 5,610,103.

[51] Int. Cl.⁶ .................................................. H01L 21/463
[52] U.S. Cl. ............................. 156/379.6; 156/580.1; 156/73.1; 156/382; 264/442; 228/262
[58] Field of Search ............................ 156/73.1, 381, 156/382, 390, 379.6, 580.1; 264/442, 445; 228/262

[56] References Cited

U.S. PATENT DOCUMENTS 5,520,784  5/1996  Ward .

FOREIGN PATENT DOCUMENTS 1022536  1/1989  Japan ................................ 156/73.1

*Primary Examiner*—Michael W. Ball
*Assistant Examiner*—Sam Chuan Yao
*Attorney, Agent, or Firm*—Michaelson & Wallace

[57] ABSTRACT

A method of eliminating or substantially eliminating voids formed in the bottom of high aspect ratio holes following the physical vapor deposition of a material over the surface of a substrate. The method includes placing the substrate in an ultrasonic processing chamber filled with a fluid and having an ultrasonic source. The ultrasonic source is used to generate ultrasonic waves at a frequency no higher than is sufficient to cause a flow of the material adjacent the voids into these voids, without significantly affecting the deposited material elsewhere on the substrate.

8 Claims, 2 Drawing Sheets

5,851,344

ULTRASONIC WAVE ASSISTED CONTACT HOLE FILLING

This is a division of application Ser. No. 08/570,762, filed Dec. 12, 1995, now U.S. Pat. No. 5,610,103.

BACKGROUND

1. Technical Field:

This invention relates to the elimination of voids formed when material deposited over a surface of a substrate having holes therein, such as for vias, contacts, or lines, fills a top portion of the holes but not a bottom portion thereof, and more particularly, to the elimination of such voids formed during a physical vapor deposition process.

2. Background Art:

Physical vapor deposition (PVD) of materials onto a substrate is a vital step in the manufacture of semiconductor devices. For example, this process is often used to deposit electrically conductive materials into high aspect ratio holes (i.e. holes with a depth to width ratio greater than one) forming inter-level vias or contacts within a semiconductor substrate. Traditionally, physical vapor deposition techniques have involved sputtering particles from a sputter target into a PVD processing chamber which is held in a ultra-high vacuum condition. Typically, the sputtered particles have a neutral charge and tend to move in straight line paths within predictable trajectories from the target surface. Most of these trajectories are other than perpendicular to the surface of the substrate. In some applications, a plasma is used to ionize some of the sputtered particles, which are then drawn toward the substrate by an electrically biased substrate pedestal. The biased pedestal imparts a directionality to the ionized atoms, including those traveling non-perpendicular to the substrate, so that they impact the substrate in a predetermined orientation. Ideally, for filling the aforementioned high aspect ratio holes, the direction of the ionized atoms would be perpendicular to the surface of the substrate. However, the aforementioned plasma formed in traditional physical vapor deposition processing devices usually exhibits a relatively low density, and so a very low ionization rate. Consequently, few of the sputtered atoms are actually ionized and most remain neutrally charged. Thus, in either of the above-described sputtering processes, a majority of the sputtered particles are neutrally charged, and do not change direction after leaving the surface of the target. This results in many of the sputtered particles not even reaching the substrate, and those that do impinge on the substrate in random directions. Many of these particles impact in a generally traverse direction to the surface of the substrate and build up along the upper walls of a high aspect ratio hole. This causes the top of the hole to be filled first and close off, leaving a void in the bottom portion. Such a void in the bottom of the hole can make the inter-level via an unreliable electrical contact.

FIG. 1 exemplifies a semiconductor substrate 10 produced according to the aforementioned prior art physical vapor deposition methods. As can be seen in this cross-sectional view, the substrate 10 includes a bottom layer 12 of silicon with an overlying oxide film layer 14 (i.e. $SiO_2$). A high aspect ratio hole 16 exists in the oxide film layer 14. In addition, a layer 18 of aluminum (Al) has been deposited over the oxide film layer 14. Due to the aforementioned randomly impacting sputtered atoms, the deposition material has built up on the upper walls of the hole 16 and closed it off, resulting in a void 20 in the lower portion of the hole 16.

In the past, attempts at eliminating the void once it has formed have involved heating the substrate and/or subjecting it to a high pressure environment. The heating is intended to soften the deposited material so that it flows into the hole, a process known as "reflow". At elevated temperatures, a metal will creep along a surface and fill any low spots in the film layer within which the metal resides. Although this method can work for many applications, temperatures high enough to flow some deposition materials would also damage the substrate or the structures formed thereon. Accordingly, heating the substrate to eliminate the void is sometimes undesirable. Subjecting the substrate to a high pressure atmosphere mechanically forces the material deposited over the top of the hole into the void space due to the force exerted by the high pressure atmosphere on the material. The material may have been softened by heating to facilitate this forcing. Although this latter method works well for the applications it was intended, some disadvantages exist. For example, the pressures required to force material into the void can sometimes approach 10 kpsi depending on the characteristics of the deposition material and its thickness over the void. A pressurizing device capable of producing pressures as high as 10 kpsi can be quite complex. In addition, the high pressure can in some instances damage the substrate or the structures formed thereon.

There has been an attempt to avoid the use of these high temperatures and pressures by employing ultrasonic vibration during the deposition process. This method involves fastening the substrate to a base, then subjecting the base, and so the substrate, to ultrasonic energy while at the same time sputter depositing aluminum on the substrate. The substrate is also heated, but at a lower temperature than typically used in the previously described processes. Although, this method works well for the application it was intended, there are drawbacks. The process must be carried out in a deposition chamber which has been specifically modified to impart the ultrasonic energy and heat during the actual deposition procedure. It is unknown what effects the ultrasonic energy and relatively low temperature will have on the deposition process or the resulting deposition layer, or whether existing deposition chambers can be retrofitted with the necessary equipment. In addition, it is believed that the addition of the steps required to apply the ultrasonic energy and heat could increase the deposition processing time, thereby reducing substrate throughput.

Therefore, a need exists for a method of eliminating the void left at the bottom of high aspect ratio holes which does not rely on subjecting the substrate to damaging heat or pressure, and which is not performed, in situ, during the deposition process.

SUMMARY

The present invention is directed to a novel method of eliminating or substantially eliminating the aforementioned void formed in the bottom of high aspect ratio holes following the completion of the physical vapor deposition of a material over the surface of a substrate. This method employs ultrasonic waves to create a plastic deformation in the already deposited material adjacent the void, without significantly affecting the material elsewhere on the substrate. The plastically deformed material then flows into the void due to the force exerted on it by a pressure difference between a fluid employed in the ultrasonic device producing the waves and a vacuum left in the void as a result of the previous physical vapor deposition process.

Specifically, the foregoing is attained by a method of substantially eliminating the voids which includes placing the substrate in an ultrasonic processing chamber filled with a fluid and having an ultrasonic source. The ultrasonic source is used to generate ultrasonic waves in the fluid at a frequency no higher than is sufficient to cause a flow of the material adjacent the voids into these voids. Preferably, the ultrasonic waves generated are uni-directional waves, and the substrate is oriented in the chamber such that the surface of the material deposited over the substrate is impinged by the ultrasonic waves in a substantially perpendicular direction.

In the case where the exact frequency which will cause the material overlying the void to flow is not known, the ultrasonic waves are initially generated at a relatively low frequency. Then, the frequency is increased over time until the material adjacent the voids flow into the voids.

The above-described process is performed in a stand-alone ultrasonic processing unit, and only after the deposition process has been completed to form the film layer being subjected to the ultrasonic waves. Thus, there is no question is of affecting the deposition process, or having to modify existing deposition equipment, as with some methods which employ ultrasonic vibration and low level heat during the deposition process itself. The deposition process can be accomplished as before, and the aforementioned voids filled afterwards. This has considerable advantages. First, the deposition process is complex and the quality of the resulting deposition layer is dependent on many factors. It is believed the introduction of low level heat and ultrasonic vibration during the deposition process could have unknown complicating effects. Existing deposition chambers can be employed, as is, using the described embodiments of the present invention. It is unknown whether these existing units can be modified to include an ultrasonic capability during deposition. It is possible all new equipment would have to be purchased to implement the ultrasonic treatment into the deposition process. In addition, deposition chambers are relatively complex and expensive pieces of equipment, as compared to a ultrasonic processing chamber. Instead of tying up the more expensive deposition equipment due to a potential increase in processing time required to accomplish the aforementioned concurrent ultrasonic vibration procedure, substrate throughput from the deposition chamber can be maintained by employing separate ultrasonic chambers to eliminate the unwanted voids.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

Preferred embodiments of the present invention will now be described with reference to the drawings.

Figure 2:
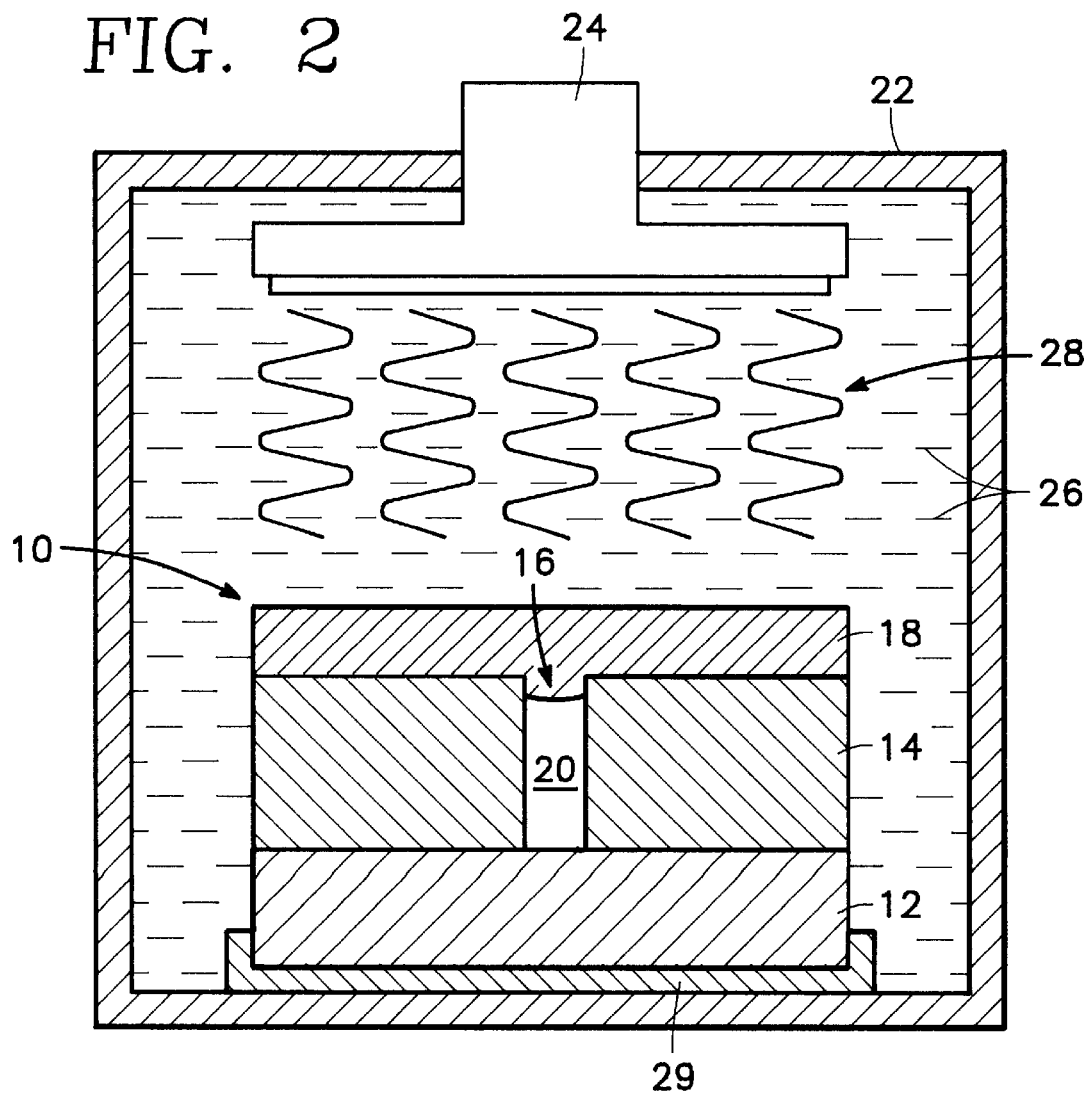
FIG. 2 is a cross-sectional, schematic drawing of a ultrasonic device employed to perform a method of eliminating inter-level via voids in a substrate according to the present invention.

FIG. 2 depicts an ultrasonic apparatus having a processing chamber 22 containing an ultrasonic source 24 and filled with a fluid 26. The ultrasonic source 24 employed should have a mode of operation in which uni-directional ultrasonic waves 28 are produced in the longitudinal direction within the chamber 22. Although any suitable ultrasonic chamber 22 and source 24 can be employed, one suggested apparatus is the GENSIS ultrasonic generator manufactured by Crest Ultrasonics. In addition, it is preferred that the fluid 26 filling the chamber 22 be de-ionized water. De-ionized water will transmit the ultrasonic energy to the substrate without causing any adverse reactions with the substrate 10 or any of its incorporated structures. However, it is not intended that the present invention be limited to using deionized water. Any suitable fluid, including other liquids and pressurized gases, can be employed through which sufficient energy in the form of ultrasonic waves can be transmitted to the substrate while not causing any undesirable reactions with the substrate.

Figure 1:
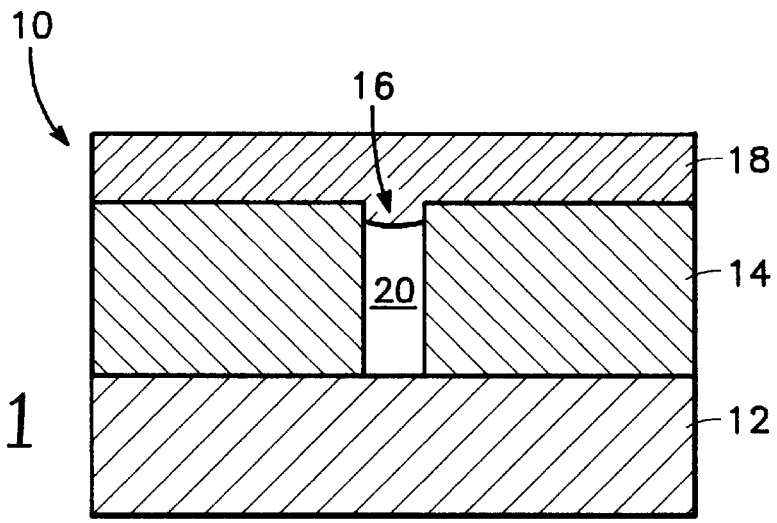
FIG. 1 is a cross-sectional drawing of a semiconductor substrate following physical vapor deposition showing an inter-level via or hole with void in its lower portion.
Figure 3:
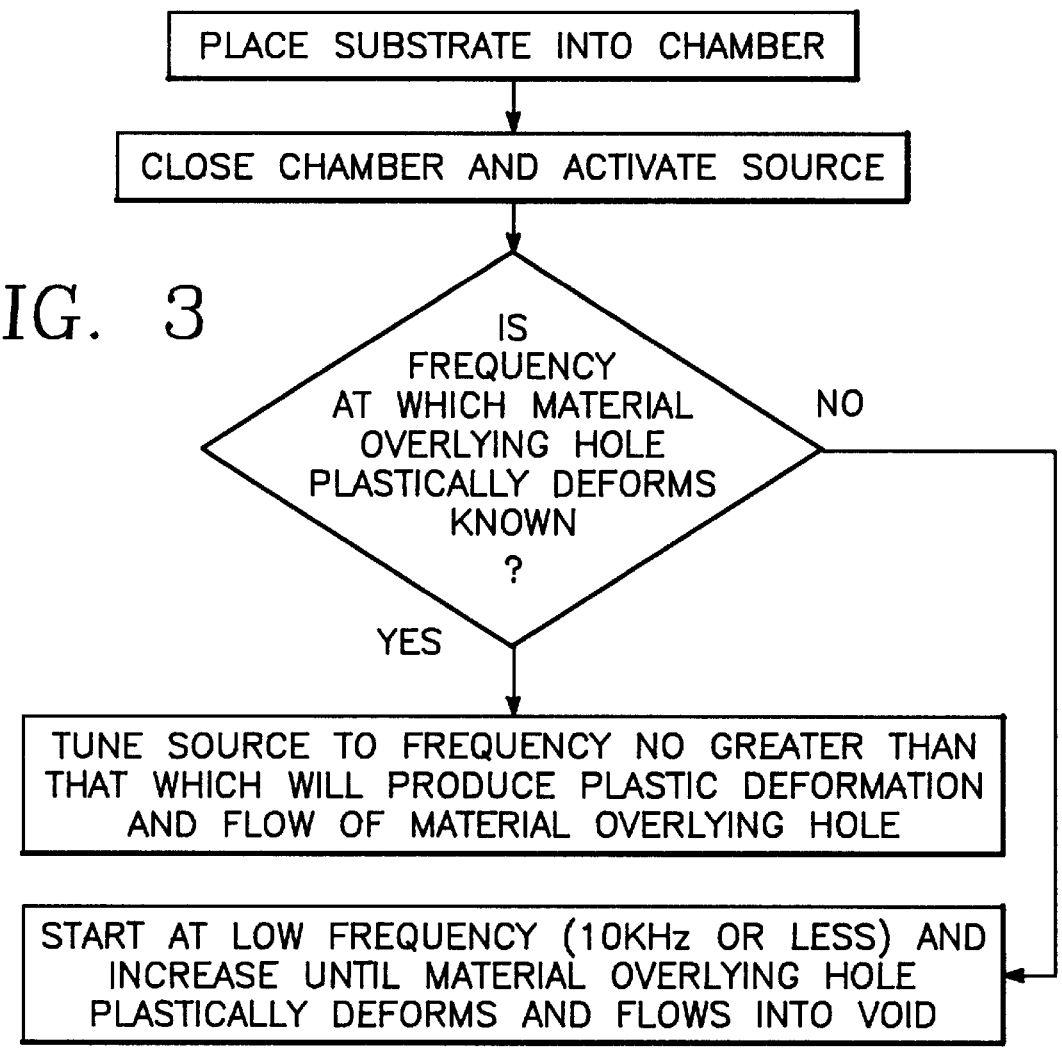
FIG. 3 is a block diagram of a method of eliminating inter-level via voids in a substrate according to the present invention.

In reference to FIGS. 2 and 3, a method according to the present invention will be described. A substrate 10, such as the one described in association with FIG. 1, is placed in the chamber 22, preferably disposed in a substrate holder 29. It is noted that the relative size and proportion of the substrate 10 and holder 29 is changed to better show the effect of the present invention. Preferably, the substrate holder 29 orients the substrate 10 such that the longitudinally propagating ultrasonic waves 28 generated by the source 24 impact the exterior-facing surface of the deposited layer 18 in a substantially perpendicular direction. Once the substrate 10 is in place, the chamber 22 is closed and the ultrasonic source 24 activated. The process preferably takes place with the chamber 22 at ambient pressure and temperature, or even at a reduced pressure and temperature. The ultrasonic waves 28 generated by the source 24 will propagate through the fluid 26 and impinge on the surface of the deposited layer 18 of the substrate 10. This causes a longitudinally directed vibration in the material making up the deposited layer 18. If enough energy is absorbed from the ultrasonic waves 28 by the layer 18, the vibration will result in the deposited layer 18 undergoing a plastic deformation. Plastic deformation of the deposition layer 18 is desirable as will become apparent below. To achieve the desired deformation, the frequency of the ultrasonic waves 28 is made high enough to ensure sufficient energy is absorbed by the deposition layer 18. The maximum energy absorption occurs when the frequency of the ultrasonic waves 28 is high enough to cause a resonance condition within the deposition layer material. It is believed that at resonance the energy absorption will be at least sufficient in most commonly used deposition layer materials (e.g. aluminum) to cause the aforementioned plastic deformation. However, a lower frequency may be sufficient to trigger the deformation. Methods associated with selecting an ultrasonic wave frequency which will cause the desired deformation of the deposition layer material (and perhaps a resonance condition) will be discussed later.

Once the deposition layer material undergoes plastic deformation from the action of the impinging ultrasonic waves 28, it will flow into the aforementioned void 20 due to the pressure differential between the void 20 and the chamber fluid 26. The original physical vapor deposition process was conducted in a ultra-low pressure environment. Accordingly, the void 20 will-exhibit this same low pressure (typically on the order of $10^{-2}$ to $10^{-3}$ torr). The fluid 26 inside the chamber 22, on the other hand, is preferably at ambient pressure, or at least a higher pressure than that of the void. Accordingly, the pressure inside the chamber 22 will exceed that existing within the void 20, thereby creating the aforementioned pressure differential. The flow of the deposition layer material into the void 20 occurs because the aforementioned plastic deformation softens the material enough that the force exerted on it by the pressure differential pulls the material into the void 20. Thus, the void 20 is eliminated (or at least substantially eliminated).

Preferably, only the deposited material adjacent the void 20 undergoes the aforementioned plastic deformation and flow. This selective process is possible because the frequency at which the portion of the deposited layer 18 near the void 20 will plastically deform is different from the frequency at which the remaining portion of the deposited layer 18 will deform. It is believed that the frequency which will cause the plastic deformation of the portion of the deposition layer 18 adjacent a hole 16 is lower than the frequency which would cause deformation in the remainder of the deposited layer 18. Accordingly, the frequency of the ultrasonic waves 28 produced from the source 24 can be manipulated such that plastic deformation is created in the portion of the deposition layer material near the void 20 and not in the remaining portion of the layer 18. Thus, it is preferred that the ultrasonic source 24 be tuned to a frequency no greater than that which will produce the aforementioned plastic flow in the deposition layer material near the void 20.

Of course, the exact frequency at which the material will reach this point of plastic deformation and flow will vary depending on the mechanical characteristics of the material itself and its thickness. Accordingly, in the case where this exact frequency is not known, the preferred method is to start at a relatively lower frequency, say around 10 kHz or less, and increase the frequency until the deposition layer material adjacent the void 20 is displaced into the hole 16. For an aluminum deposition layer of typical thicknesses produced by physical deposition methods, the point of plastic deformation and flow is believed to be in the several tens of MHz range.

As alluded to previously, the frequency at which the aforementioned plastic deformation will occur is believed to be at or near the resonant frequency of the material adjacent the void, although this may not always be the case. A lower frequency might trigger the flow. However, even if plastic flow occurs at a frequency lower than the resonant frequency, the deposition layer material not adjacent the hole 16 will still be essentially unaffected. As explained above, it is believed a higher frequency than that required to deform the material overlying the hole 16 is required to deform the material overlying the remaining portions of the substrate 10.

Figure 4:
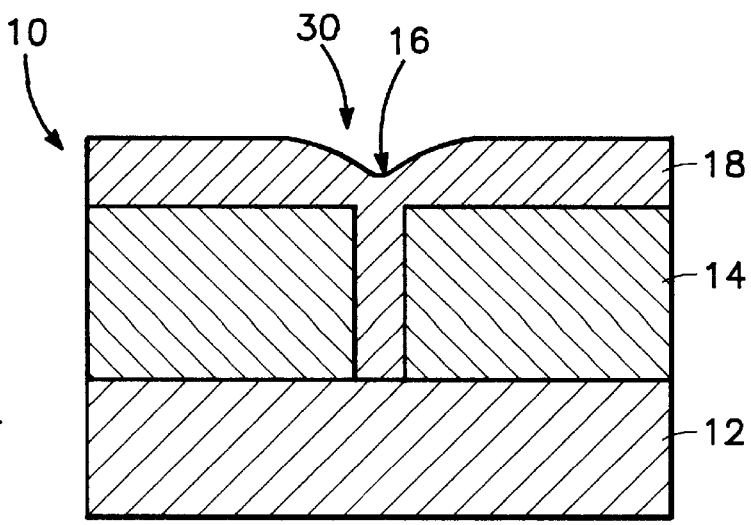
FIG. 4 is a cross-sectional drawing of a semiconductor substrate following the elimination of inter-level via voids by the method of FIG. 3.

FIG. 4 exemplifies the substrate 10 after the ultrasonic processing is complete. As can be seen, the deposition layer material previously adjacent the void has flowed to the bottom of the hole 16. A dip or indentation 30 will exist in the area outside the filled hole 16. If irrelevant to the performance of the device being manufactured, this indentation can remain. However, if desired, the surface can be planarized via well known methods. This planarization can be accomplished after additional material has been deposited over the surface of the substrate, if desired. It is also noted that FIG. 4 depicts a case where the deposited layer was thick enough that the entire depth of the hole 16 was filled. However, if the diameter of the hole or the thickness of the deposited layer is such that some portion of the upper portion of the hole is not filled, additional steps can be taken to complete the hole-filling process. For instance, additional material could be deposited over the surface of the substrate. As discussed previously, a typical physical vapor deposition process will result in material being deposited onto the upper walls of a high-aspect ratio hole. Accordingly, the very area that requires filling will be filled by this further deposition. Of course, the resulting surface of the substrate would include a dip or indentation in the area overlying holes. This unevenness can be eliminated by the aforementioned planarization processes.

While the invention has been described in detail by reference to the preferred embodiment described above, it is understood that variations and modifications thereof may be made without departing from the true spirit and scope of the invention. For instance, the fluid employed in the above-described ultrasonic processing chamber could be chosen to enhance the energy transfer to the substrate, or to perform some additional process on the substrate during the ultrasound procedure. Additionally, the temperature and pressure within the ultrasonic processing chamber might be manipulated to enhance the hole-filling process. For example, increasing the temperature and/or pressure inside the chamber could enhance the hole filling process, as long as these increases are not so large as to damage the substrate.

Wherefore, what is claimed is:

1. An apparatus for substantially eliminating voids caused when material previously deposited in a vacuum over a surface of a substrate having holes extending through a film layer thereon fills a top portion of the holes but not a bottom portion thereof, the apparatus comprising:

(a) an ultrasonic processing chamber, said chamber being filled with a fluid comprising one of (i) a liquid, or (ii) a pressurized gas;

(b) a substrate holder for holding said substrate within the ultrasonic chamber; and, (c) an ultrasonic source for generating ultrasonic waves in the fluid, said source being positioned such that said waves traveling through said fluid are capable of impinging on an exposed surface of the material deposited over the surface of the substrate when said substrate is installed in said substrate holder.

2. The apparatus of claim 1 wherein the ultrasonic source comprises:

means for generating the ultrasonic waves with a frequency no higher than is sufficient to cause a flow of the material adjacent said voids into the voids.

3. The apparatus of claim 1 wherein:

(a) the ultrasonic source comprises means for generating substantially uni-directional waves; and, (b) the substrate holder orients the substrate such that the surface of the material deposited over the substrate is impinged by the uni-directional ultrasonic waves in a substantially perpendicular direction.

4. The apparatus of claim 1 wherein the ultrasonic source comprises:

(a) means for initially generating the ultrasonic waves at a relatively lower frequency; and, (b) means for increasing the frequency of the ultrasonic waves over time until the material adjacent the voids flow into the voids.

5. The apparatus of claim 1 wherein:

the fluid filling the chamber is non-reactive to the substrate and any structures formed thereon.

6. The apparatus of claim 1 wherein:

the fluid filling the chamber is de-ionized water.

7. The apparatus of claim 1 further comprising:

means for maintaining the interior of the chamber at a temperature and pressure which is not detrimental to the substrate and any structures formed thereon.

8. The apparatus of claim 7 wherein the maintaining means comprises:

means for maintaining the interior of the chamber at ambient temperature and pressure.

* * * * *